United States Patent [19]

Gelchinski et al.

[11] Patent Number: 4,497,692
[45] Date of Patent: Feb. 5, 1985

[54] LASER-ENHANCED JET-PLATING AND JET-ETCHING: HIGH-SPEED MASKLESS PATTERNING METHOD

[75] Inventors: Mordechai H. Gelchinski, Bedford Hills; Lubomyr T. Romankiw, Briarcliff Manor; Donald R. Vigliotti, Yorktown Heights; Robert J. Von Gutfeld, New York, all of N.Y.

[73] Assignee: International Business Machines Corporation, Armonk, N.Y.

[21] Appl. No.: 504,016

[22] Filed: Jun. 13, 1983

[51] Int. Cl.³ .................. C25D 5/02; C25D 5/08; C25D 21/10; C25F 3/02
[52] U.S. Cl. .................. 204/15; 204/129.3; 204/129.6; 204/224 R; 204/273
[58] Field of Search .................. 204/15, 129.6, 129.7, 204/129.5, 129.3, 273, 275, 157.1 L, 224 R

[56] References Cited

U.S. PATENT DOCUMENTS

| | | | |
|---|---|---|---|
| 2,799,637 | 7/1957 | Williams | 204/143 |
| 2,846,346 | 8/1958 | Bradley | 148/33 |
| 2,930,949 | 3/1960 | Roschen | 317/235 |
| 3,039,515 | 6/1962 | Figlio et al. | 156/345 |
| 3,345,274 | 10/1967 | Schmidt | 204/15 |
| 3,486,221 | 12/1969 | Robinson | 29/620 |
| 3,679,863 | 7/1972 | Houldcroft et al. | 219/121 LM |
| 3,810,829 | 5/1974 | Fletcher | 204/222 |
| 3,965,328 | 6/1976 | Locke | 219/121 LM |
| 4,042,006 | 8/1977 | Engl et al. | 164/46 |
| 4,217,183 | 8/1980 | Melcher et al. | 204/15 |
| 4,283,259 | 8/1981 | Melcher et al. | 204/129.3 |
| 4,390,774 | 6/1983 | Steen et al. | 219/121 FS |
| 4,409,458 | 10/1983 | Inoue | 219/69 D |

Primary Examiner—Thomas Tufariello
Attorney, Agent, or Firm—Graham S. Jones, II

[57] ABSTRACT

This metal deposition/material removal technique modifies free-standing or submerged jet plating with an electromagnetic energy beam such as an intense laser beam, directed collinearly along the jet. Experiments were made to deposit gold contact areas on nickel plated beryllium-copper substrates used for microelectronic connectors. The deposits are found to be crack-free and dense, possessing excellent adhesion to the substrate. Deposition rates for 0.05 cm diameter gold spots are on the order of 10 micrometers per second.

54 Claims, 14 Drawing Figures

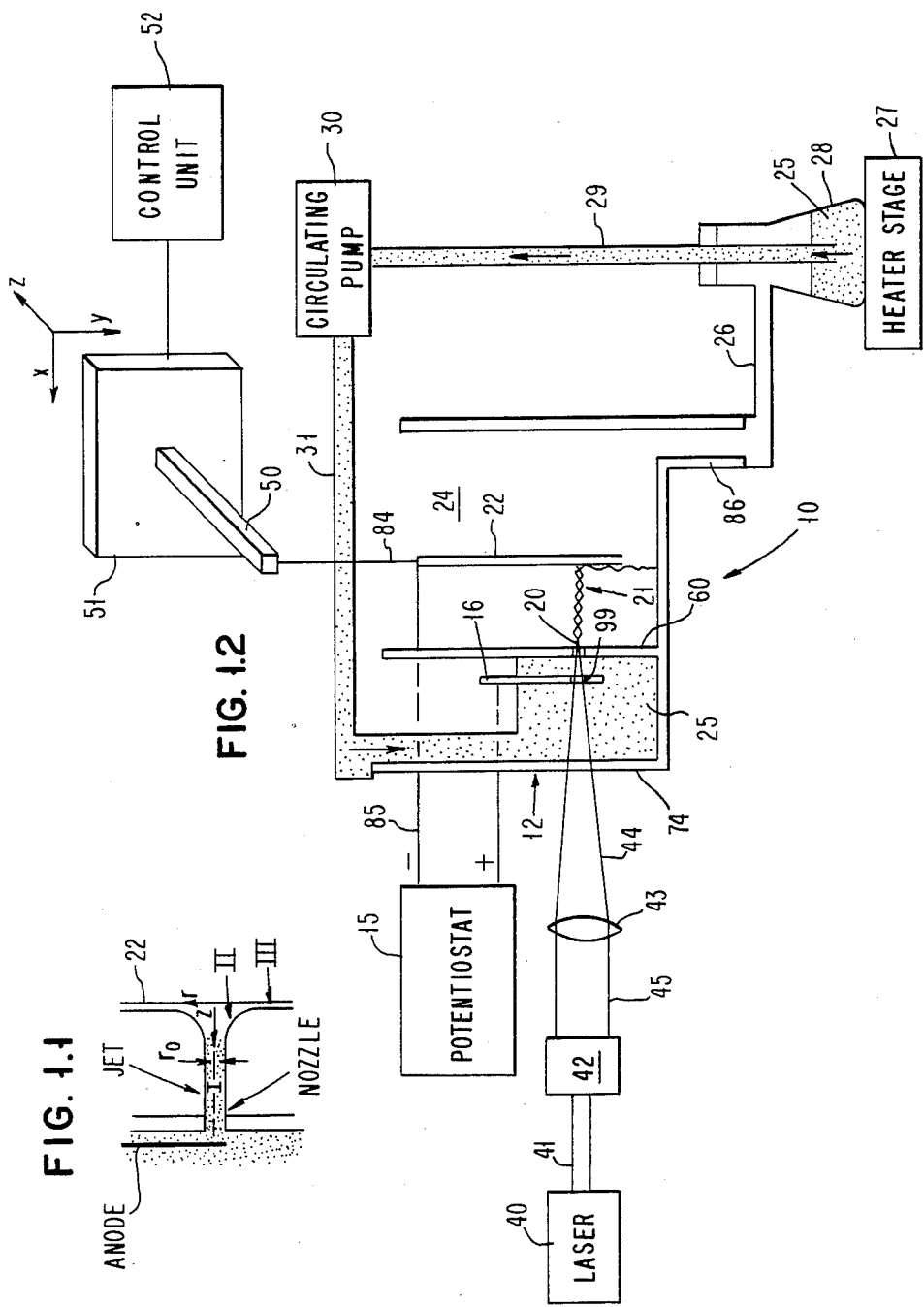
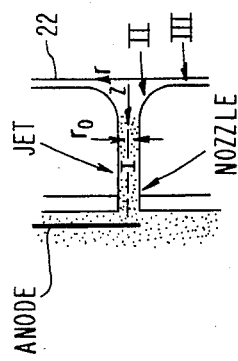
FIG. 1.1
FIG. 1.2

FIG. 2.1
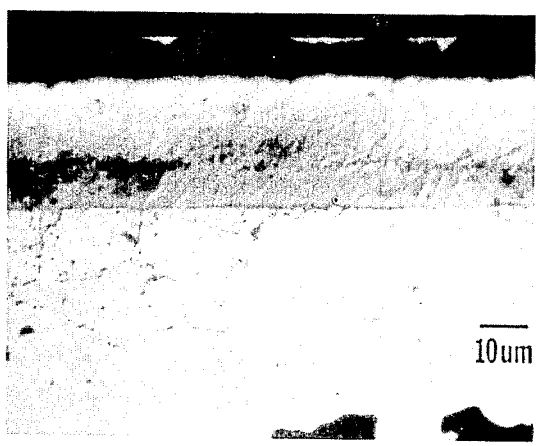
FIG. 2.2
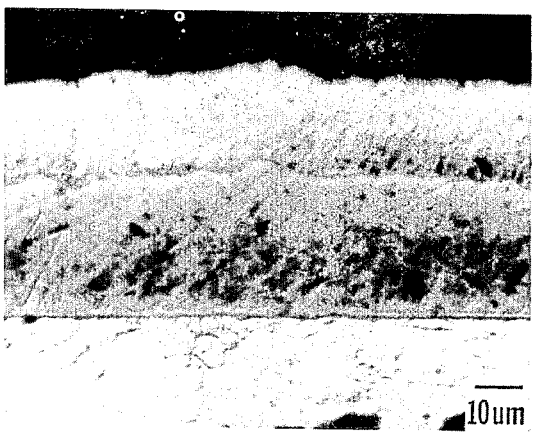
FIG. 2.3

FIG. 3.1
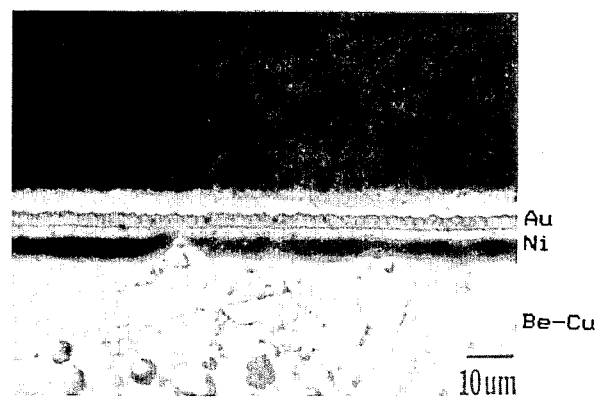
FIG. 3.2
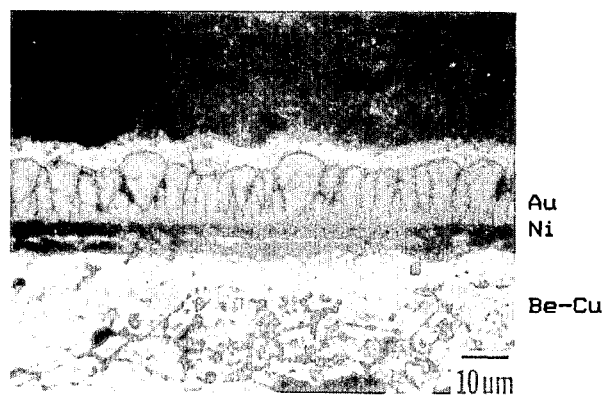
FIG. 3.3
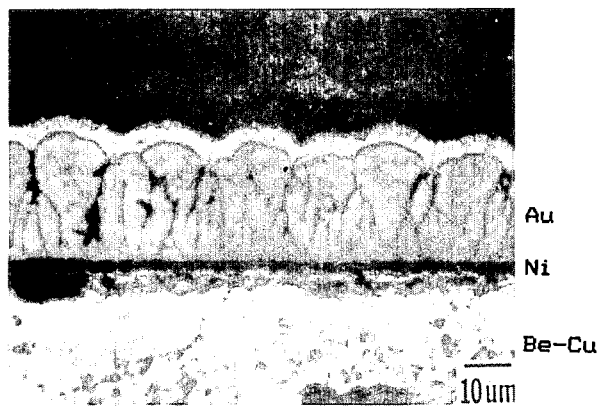

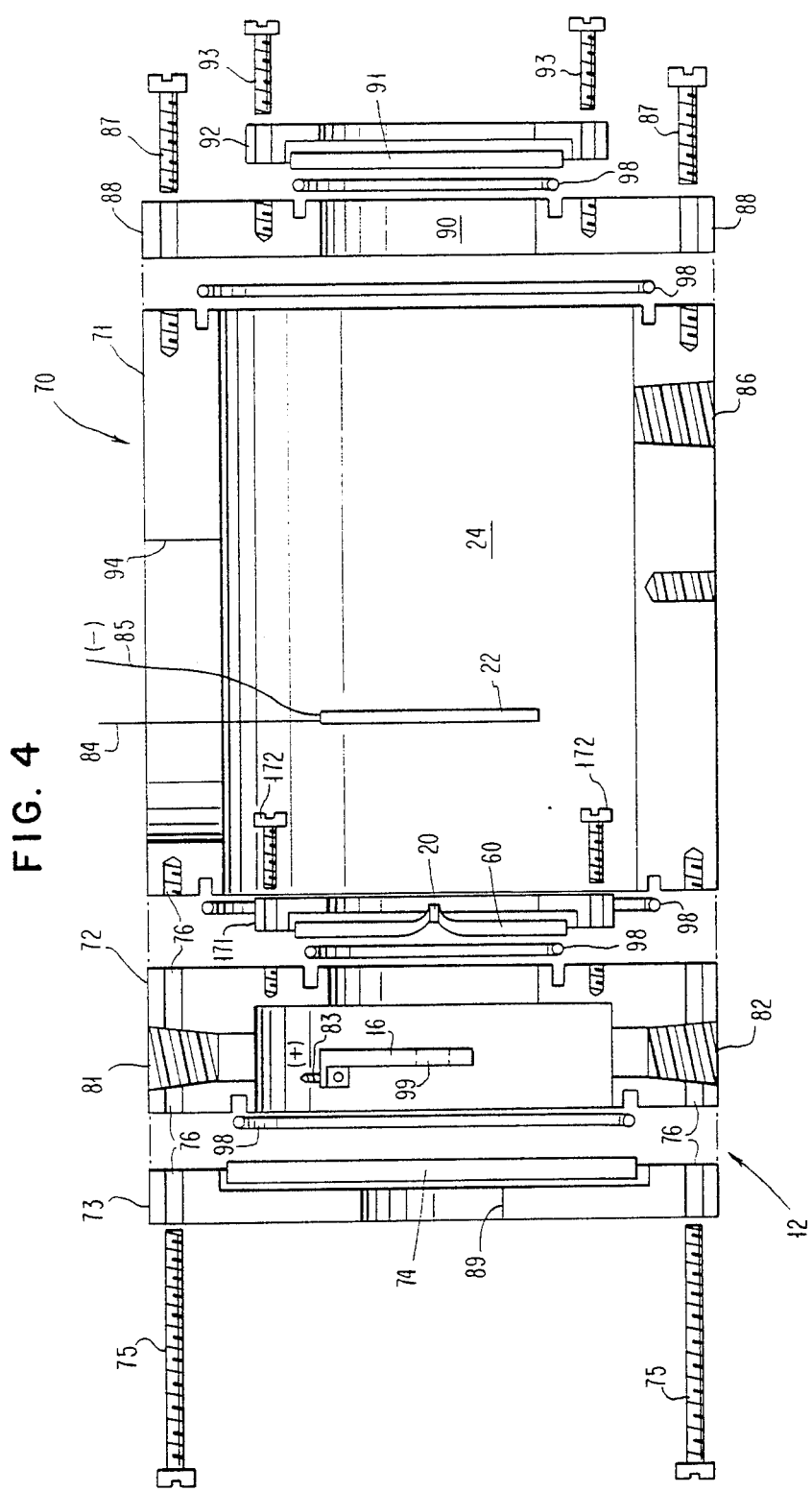

FIG. 5.1
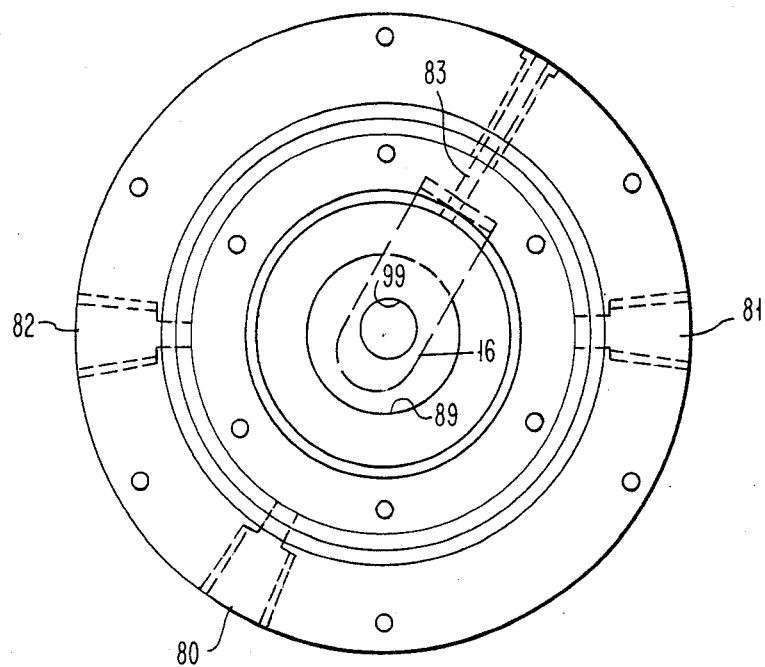
FIG. 5.2
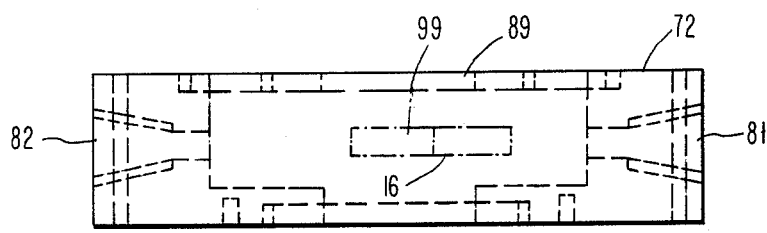

FIG. 6
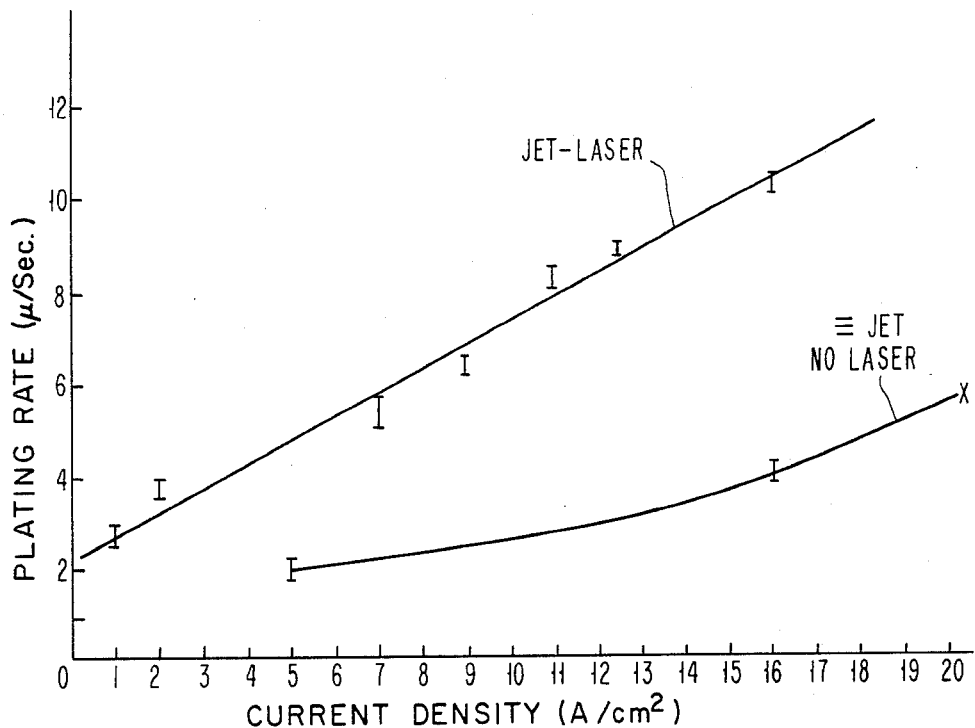
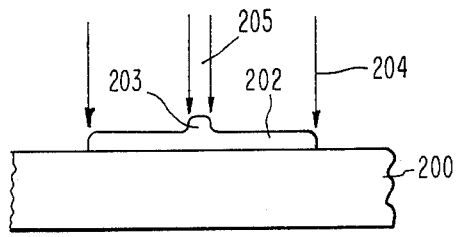
FIG. 7.1
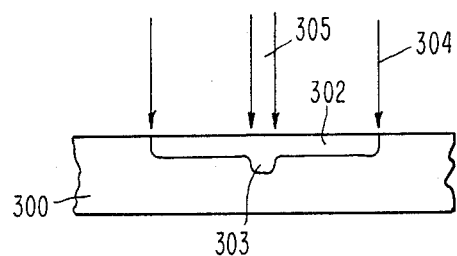
FIG. 7.2

LASER-ENHANCED JET-PLATING AND JET-ETCHING: HIGH-SPEED MASKLESS PATTERNING METHOD

BACKGROUND OF THE INVENTION

1. Field of the Invention

The present invention relates to laser-plating and laser-etching processes and more particularly to jet-plating and jet-etching processes enhanced by performing the jet-plating or jet-etching process in combination with a laser beam.

2. Description of Related Art

Laser-enhanced plating has been described in a number of recent technical publications and patents. The main desirable features of laser-enhanced plating are enhanced plating rates and localization of the deposit without the use of a mask. However, we have found that the available ion supply at the cathode, though greatly increased by the agitation caused by the energy from the laser beam is still insufficient for the desired speed of non-porous, high quality gold plating.

Commonly assigned U.S. Pat. Nos. 4,283,259, 4,239,789 and 4,217,183 discuss the use of heating by means of a laser to enhance plating and etching rates locally.

The use of jet plating is well known, as shown by some of the references discussed below.

U.S. Pat. No. 3,267,014 of Sanders, "Process for Rapidly Etching a Flat-Bottomed Pit in a Germanium Wafer" describes a jet etching system which involves D.C. current passing through a jet and also uses a lamp producing incandescent light directed upon the germanium wafer to activate electrical current where the jet hits the wafer. The lamp has an intensity of 500 watts, and is spaced six inches from the pit. The lamp was not employed for increasing the activity level of the electrochemical reaction involved in the etching process. The light from the lamp produces electron-hole pairs. The system involves no plating or thermal effects.

In U.S. Pat. No. 3,039,515 of Figlio et al, "Fabrication of Semi-conductor Devices" a source of light and a jet are directed at a semi-conductor to be etched. The light is a low power incandescent lamp of only 150 watts having a back ellipsoidal mirror behind it and another ellipsoidal mirror behind the semiconductor through which the jet passes. This is contrasted with use in the prior art of four lamps providing 1000 watts to produce photoconductivity to the degree required. While the light is directed to a mirror which reflects it coaxially with the jet of electrochemical etching fluid, it does not suggest directing the beam through the fluid, and the intensity of the beam in terms of watts per square centimeter is low relative to that of a laser beam. No suggestion of plating is made.

In Tiley et al, "Part II-Electrochemical Techniques for Fabrication of Surface-Barrier Transistors" Proceedings of the IRE Vol. 41,pp 1706-1708 (1953) two lasers are directed to the front and the back of a Ge substrate which is etched or plated using electrical currents for etching or electroplating with the electrolyte passing from the jet. Light is mentioned as helping to increase current in the barrier region of the germanium. This article makes it clear that jet electroplating and electroetching are both well known techniques which have been practiced for about two decades and that the photoconductivity effect on plating current has been known for all of that time, but the concept of adding the use of the laser to enhance the process has not been suggested, until now.

Schnable et al, "Jet-Electrolytic Etching and Plating", Electrochemical Technology Vol. 1, No. 7-8 pp 203-210 (July-August 1963) is also an early article on electroetching and electroplating which suggests the use of light to enhance the etching with a high intensity light of the kind suggested by Parsons and the Figlio et al patent cited above. No laser is described. The applied illumination wavelength must be above the band gap of the semiconductor to create electron-hole pairs. Use of the light to produce substantial heating is not suggested.

In U.S. Pat. No. 4,251,327 of Grenon et al, "Electroplating Method", light is directed through a bath onto a solar cell which generates electricity in the solar cell wafer which enables plating on the solar cell wafer. The patent is not particularly relevent.

U.S. Pat. No. 3,928,154 of Andrews, "Electrochemical Radius Generation" relates to electrochemical etching using a jet but is not particularly relevant otherwise.

In U.S. Pat. No. 3,265,599 of Soonpaa, "Formation of Grain Boundary Photo-Orienter by Electrolytic Etching", electrochemical etching illumination is used to enhance operation of an electrolytic bath to etch along grain boundaries. It does not mention a jet or plating.

4,340,617 of Deutsch et al, "Method and Apparatus for Depositing a Material on a Surface" Deutsch et al relates to photochemical or photolytic dissociation of solution in a fluid or gas-filled chamber. In particular, it teaches use of a gas-filled chamber into which the laser beam is directed. The laser produces photodecomposition. The material which is photodecomposed is deposited on the substrate. No suggestion is made of use of a jet, or of plating or etching by electrochemical means.

U.S. Pat. No. 3,706,645 of Lasser, "Process Including Photolytic Enhancement for Anodic Dissolution of a Gallium Arsenide Wafer" uses a laser beam to cause photolytic action on the surface of a gallium arsenide wafer to be etched. It has nothing to do with plating, jets and metallic patterning.

See German Patent DE No. 3 227 878 A1 "Verfahren und Vorrichtung zum galvanischen Abscheiden einges Metalls auf ein Werkstuck"

Investigations on the experimental parameters, mechanisms and applications of laser-enhanced plating have been described in several previous reports including as follows:

R. J. von Gutfeld, E. E. Tynan, R. L. Melcher and S. E. Blum, Appl. Phys. Lett. Vol.35, p.651 (1979);

R. J. von Gutfeld, E. E. Tynan, L. T. Romankiw, Ext. Abstract 472 Electrochem. Soc. 79-2 (1979), Los Angeles, CA.;

J. Cl. Puippe, R. E. Acosta and R. J. von Gutfeld, J. Electrochem. Soc. Vol. 128, p. 2539 (1981); and R. J. von Gutfeld, R. E. Acosta and L. T. Romankiw, IBM J. of Res. & Develop. Vol.26, p.136 (1982).

Past emphasis has been on laser-enhanced copper plating with a detailed study of the system $Cu/Cu^{++}$ (Puippe et al, supra.) More recent experiments have concentrated on maskless, laser-enhanced gold patterning with the goal of realizing cost savings particularly in the application of microelectronic contact areas, as described in von Gutfeld, Acosta and Romankiw supra;

R. J. von Gutfeld, M. H. Gelchinski. L. T. Romankiw, Abstract 663 RNP Electrochem. Soc. Meeting, Denver, CO (1981); and M. H. Gelchinski, L. T. Romankiw and R. J. von Gutfeld, Extended Abs.Vol. 131, p206 Electrochem. Soc., Detroit, MI (1982).

Additional references include

D. R. Turner, Thin Solid Films Vol.95, p.143 (1982);

R. C. Alkire and T. J. Chen, J. of Electrochem. Soc. Vol.129 p.2424 (1982); and

R. Haynes, K. Ramachandran and D. J. Fineberg, The Western Electric Engineer, Vol. 22, p.61, (1978).

SUMMARY OF THE INVENTION

It is an object of this invention to use an energy beam (laser) in jet-chemical plating and jet-chemical etching of any variety to achieve improved product quality at high rates of plating or etching. The advantage here is that patterns can be formed without application of masks to the objects being plated or etched. Plating or etching is accomplished selectively by applying a laser to spots to be plated or etched concomitantly with use of a jet to circulate the plating solution rapidly at the surface of the object to be plated. The laser beam is directed so that it passes along the length of the jet of fluid which acts as an optical waveguide for the laser beam.

In accordance with this invention, a process of chemically-enhanced additive or subtractive processing of a substrate in a chemically-active fluid is provided comprising directing a high intensity energy beam to heat the substrate concomitantly with directing a jet of the fluid at the locus of desired enhanced chemical action on the substrate.

Preferably, in the above method the fluid is an electrolyte.

It is also preferred that the plating or etching is performed electrochemically.

In another aspect, to the above process, the energy beam is collinear with the jet.

In another aspect of this invention, the jet and the laser beam are collinear but are of unequal radii.

The above process wherein the energy beam is a laser beam and the jet serves as an optical waveguide for the laser beam, whereby the processing is focussed on an area defined by the point of impact of the jet upon the substrate.

A process in accordance with the above wherein jet is larger in diameter than the energy beam thereby permitting a large ionic resupply surrounding a finely focussed energy beam employed for patterning (etching/plating).

Preferably the energy beam is a laser beam.

Preferably, this invention is a method for greatly increasing plating (etching) rates by combining laser and jet-plating and jet-etching techniques. An energy beam which is preferably a laser beam is directed through a free-standing jet stream of plating (etching) electrolyte solution. The jet acts as a light guide, trapping the light within the fluid column of the jet.

The energy beam can be a laser or other energy beam with laser beams being preferred. It is possible to employ microwaves and other energy beams as well under appropriate circumstances.

For a laser beam having a diameter comparable to the diameter of the jet of electrolyte, both the fluid and the light will strike the cathode coincidentally, i.e. in the same spot. Voltage between the anode and the cathode can be applied by a power supply connected between the substrate onto which the jet and the laser are impinging and an electrode suitably positioned inside the compartment containing the nozzle.

In accordance with this invention, plating or etching is accomplished selectively by applying an energy beam such as an electromagnetic beam preferably in the form of laser to spots to be plated concomitantly with use of a jet to transport the plating solution rapidly to and at the surface of the object to be chemically treated by plating, etching, etc. The laser beam is passed along the length of the jet of fluid which acts as a light guide or waveguide for the laser beam.

While this invention is preferably performed with collinear plating or etching, it is possible to achieve some of the advantages of the instant invention without collinear alignment of the laser beam and the jet of fluid.

Advantages of this invention are as follows:

1. The plating rate of a laser-jet combination is significantly greater than the laser alone, the jet alone or the sum of the two. For equivalent quality levels of the plated films, the plating rate is increased by about 10 to 20 times for the collinear laser-jet combination as compared to the jet plating alone. Attempts at producing nearly equivalent rates with the jet alone leads to cracked films with extremely poor adhesion, if any, in the case of gold plating.

2. The use of submerged jets plus the laser beam and the use of mechanical stirring plus the laser do not yield plating rates as high as the free jet plus the collinear laser.

3. The jet plus the laser directed from the side (i.e. not collinear with the jet) gives less highly defined plating due to the index of refraction fluctuations caused by splashing, etc. of the jet and so collinear plating is preferred in most instances. In fact it is not possible to get significant laser radiation through the jet to the desired spot as a result of the above-mentioned fluctuations. The laser can be directed into the jet at a position in front of the cathode (downstream from the orifice) for small angles between the jet and the laser beam with the result that a portion of the jet acts as an optical waveguide.

4. The reported high speed, high quality laser-jet result were obtained using a collinear arrangement in which the jet (index greater than one) acts as a waveguide to trap and guide the beam of laser light to the cathode.

5. Still further it is an advantage of this process that the plating can be performed without extensive precleaning or activation of the the substrate prior to plating, such as would normally be required to attain good adhesion in a standard plating or jet-plating process. "Activation" is a chemical process employed conventionally in the art of electroplating and like chemical additive processes, as will be well understood by those skilled in the art of electrochemistry.

The foregoing and other objects, features and advantages of the invention will be apparent from the more particular description of the preferred embodiments of the invention, as illustrated in the accompanying drawings.

BRIEF DESCRIPTION OF THE DRAWINGS

FIG. 1.1 shows a diagram of a free-standing jet (no laser) showing the impingement regions also. Region I is the free jet; region II is the region of stagnation flow; and region III is the wall jet.

FIG. 1.2 is a schematic of a laser-jet system in accordance with this invention with a laser directed through a lens to focus approximately at the center of the jet nozzle.

FIGS. 2.1–2.3 show cross-sections of laser-jet plated spots of gold plated on nickel plated Be-Cu substrates at a current density of 11 amperes per cm² with a top electrodeposited nickel layer for protecting the gold during sectioning and polishing. Note the lack of cracks and voids and the high quality of the deposit.

FIGS. 3.1–3.3 show cross-sections of deposits using the same jet and current density as in FIG. 2 but without laser radiation during plating. Note the presence of cracks and voids which are unacceptable according to quality standards for microelectronic applications.

FIG. 4 is a sectional view of a demountable jet cell which can be employed in accordance with this invention.

FIGS. 5.1 and 5.2 show end and side views of the jet support flange shown in FIG. 4 with various apertures in the flange being illustrated.

FIG. 6 is a graph of plating rates versus current density for laser-jet plating on the upper curve and jet plating on the lower curve. The results obtained for these rates are illustrated by FIGS. 2.1–2.3 and 3.1–3.3.

FIG. 7.1 is a schematic diagram illustrating bilevel plating in accordance with this invention, as produced by the use of a laser beam having a smaller diameter than a collinear plating jet.

FIG. 7.2 is a schematic diagram illustrating bilevel etching in accordance with this invention, as produced by the use of a laser beam having a smaller diameter than a collinear etching jet.

In the drawings, like elements are designated with similar reference numbers, and identical elements in different specific embodiments are designated by identical reference numbers.

DESCRIPTION OF THE PREFERRED EMBODIMENT

This invention is a method for greatly increasing plating (etching) rates by combining laser and jet plating techniques. A laser beam is directed through a freestanding jet stream of plating (etching) electrolyte solution. Here the jet acts as a light guide (optical waveguide), trapping the light within the liquid column of the jet. This comes about when the light travels at angles with respect to the jet stream that causes total internal reflection, preventing the light from leaving the jet stream to enter the air. This effect is similar to light transmission by an optical fiber. For a laser beam having a diameter comparable to the diameter of the jet of electrolyte, both the fluid and the light will strike the cathode coincidentally, i.e. in the same spot. Voltage between the anode and the cathode can be applied by a power supply connected between the substrate onto which the jet and the laser are impinging and an electrode suitably positioned inside the compartment containing the nozzle.

It can be seen from TABLE I below that the plating rate for good quality films has been increased by over an order of magnitude for the combination of collinear laser-jet plating

TABLE I

| PLATING GOOD QUALITY AND CRACK FREE FILMS | | | | |
|---|---|---|---|---|
| TYPE | RATE micrometers per second | CURRENT DENSITY Amperes/ cm² | POWER DENSITY Watts per cm² | SPOT AREA $10^{-3}$ cm.² |
| Laser-jet | 30 | 7 | 26,000 | 1.0 |
| Laser-jet | 10 | 15 | 10,000 | 2.4 |
| Jet | 1 or less | less than 5 | | |
| Laser | 1 | about 1 | 10,000 | 2.4 |
| Conventional with mask | 0.07 | 0.15 | | |

On the other hand, if quality is sacrificed using jet-plating rates higher than those giving good quality plating, we have found that gold-plating rates are enhanced by as much as a factor of 2 to 4 times or 10 to 30 micrometers per second compared to the rates obtained with the jet alone at high current densities as can be seen from the graph in FIG. 6. However, as stated previously, the quality of the deposits with laser-jet plating far exceeds that of "high speed" jet plating. This is shown by FIGS. 2.1–2.3 as compared with FIGS. 3.1–3.3, as discussed below. The highest conventional plating rate possible as quoted by Sel-Rex Division of Oxy Metal Industries Corporation "Guide to Precious Metal Processes for Engineering Applications" is 0.07 micrometers per second for the same solution (Autronex 55GV mentioned below in TABLE II.)

While the collinear jet of electrolytic liquid and laser beam are the preferred configuration for optimal plating rates and selectivity, it is possible to employ alternate configurations of the laser and jet, both with a free jet (a jet in air) and submerged jet (where the jet is ejected into a liquid electrolyte.)

ALTERNATIVE CHEMICAL PROCESSES

Laser jet-etching techniques appropriate for use with this method include jet-enhanced and laser-enhanced electroetching, electroless etching, and electrodeless etching such as thermally-enhanced or laser-enhanced exchange etching, and jet-enhanced and laser-enhanced electroplating, electroless plating, and electrodeless plating such as thermally-enhanced or laser-enhanced exchange plating.

The processes are listed without limitation to other forms of jet-etching and energy beam plating or etching and laser plating or etching techniques, laser-enhanced jet-chemical plating, and laser-enhanced jet-chemical etching, etc.

FREE-STANDING JET

A free-standing jet is a jet of liquid electrolyte, plating or etching solution which is ejected from the nozzle into an ambient atmosphere of air or another gas, as distinguished from a submerged jet which ejects into an ambient liquid so that the jet of fluid is submerged in a liquid as it leaves the nozzle.

This method combines the laser-enhanced plating technique with a free-standing jet of electrolyte to obtain localized high speed gold-plated deposits again on nickel-plated beryllium-copper substrates. The principal advantage of a free-standing jet is its ability to provide a rapid re-supply of fresh ions into the region of plating. This overcomes the usual mass transport limited plating rates, typically occurring with many standard plating solutions giving rise to current densities as high as 0.25 Amperes/cm$^2$. See Turner et al supra. (The Mass Transport limitation refers to situations of high plating current densities in which the mass velocity of ions delivered to a surface to be plated is too low to meet requirements, so there is a depletion of the concentration of ions at the plating surface.) At the same time, the jet stream limits the region of plating without the use of masks and enables patterning by relative movement of the stream with respect to the substrate(cathode) to be plated. Current flow is along the length of the jet except in the region of impingement of the jet on the cathode where radial electric fields and currents exist over a small region extending beyond the jet diameter. This gives rise to a thin plating background in the wall jet region, depicted in FIG. 1.1. A detailed analysis of the current distribution on the cathode for a 0.5 cm diameter jet nozzle used with a free-standing jet for plating has recently been reported by Alkire and Chen, supra.

FIG. 1.1 shows a diagram of a free-standing jet without a laser showing the impingement regions of the jet upon the walls or in the nozzle orifice. The jet is assumed to have a radius $r_o$ in region I as well as uniform axial velocity. Electric field varies only in the z direction. Region II is the stagnation flow region. Region III constitutes the wall jet, a thin layer of fluid which, during plating, carries very low current densities which therefore are assumed to vary only in the r direction.

In this embodiment of our invention, a laser beam 44 is directed collinearly through an optical window 74 into the free-standing jet of fluid 21 of plating solution to provide a local heating of the cathode in a manner shown schematically in FIG. 1.2. FIG. 1.2 shows a schematic of the laser-jet system. A laser beam 45 is directed through a lens 43 to produce a laser beam 44 which converges to focus approximately at the center of the jet nozzle 20, after passing through quartz window 74. The cathode 22 is attached to a numerically-controlled xyz table 51 via an extension arm 50. Table 51 is controlled by numerical-control unit 52.

In this configuration the jet of fluid 21 composed of plating solution 25 both resupplies ions to be plated from the source of plating solution 25 and acts as an optical waveguide or light pipe for the laser energy of beam 44. Approximately 70% of the input energy of beam 44 reaches the cathode 22 with the losses due to reflection at the window 74 and very weak absorption by the electrolye or plating solution 25 within the jet of fluid 21, for the particular plating solution 25 used (see Table II).

TABLE II
GOLD PLATING SOLUTION AND LASER-JET CELL PARAMETERS

| | |
|---|---|
| Gold Plating Solution | Sel-Rex* Autronex 55GV, Au cyanide, without Co complex, 4 Troy Ounces of Au/gallon. (i.e. 33 gm per liter) |
| Plating Solution Temperature | 60 degrees Celsius |
| Jet Nozzle Orifice | 0.05 cm diameter about 0.2 cm. long |
| Linear Flow Velocity | $1.0 \times 10^3$ cm. per second |
| Reynolds Number | $5.5 \times 10^3$ |
| Nozzle-Cathode Spacing | about 0.5 cm. |
| Plating Current Density | 1–16 amperes/cm$^2$ |
| CW (Continuous Wave) laser power into jet nozzle orifice | 25 Watts (available maximum for present experiments) |

*Sel-Rex, Div. of Oxy-Metal Industries Corp., Nutley, NJ 07110.

Basic elements of the laser-jet cell 10 are: an inlet chamber 12 containing the electrolyte (plating or etching) solution 25 maintained under pressure. The chamber 12 includes a platinum, gold or stainless steel anode 16 with an aperture hole 99 through which the laser beam 44 passes. The jet nozzle 20 is made from a section of capillary tube secured and sealed by being glassed into a flat pyrex glass plate 60. A cathode 22 which serves as a workpiece to be electroplated is located in plating or etching chamber 24. Cathode 22 is attached to a numerically-controlled x,y,z table to enable automatic and/or arbitrary movement of cathode 22 for deposition patterning, by moving the workpiece 22 (cathode) relative to the fluid jet 21. After impingement on the cathode 22, the electrolyte falls onto the base of the cell 10 where it passes to return line 26. Return line 26 connects to an electrolyte reservoir 28 to allow the electrolyte 25 it collects to recirculate. Reservoir 28 is heated by a heater stage 27. The electrolyte 25 (plating or etching solution) is circulated through a line 29 to circulating pump 30. The outlet of pump 30 is connected by line 31 to inlet chamber 12.

The electrolyte 25 was preheated by heater 27 to 60 degrees Celsius, consistent with the solution supplier's recommended operating temperature. Nozzle 20 has an orifice of 0.5 mm diameter which yields gold spots of similar diameter, a typical dimension for present day microelectronic contact areas. Additional operating parameters relevant to the cell and plating parameters are listed in Table I, above.

A cw argon laser 40 produces a beam 41 with power up to 25 W. Beam 41 passes through a beam expander 42 yielding beam 45 which passes through lens 43 which yields beam 44 which enters the cell 10. Beam 44 is focused to approximately the center of the jet orifice of nozzle 20 with an F-10 optical system. The wave guiding effect of the jet of fluid 21 serves to contain the expanding laser beam 44 past the focal plane located just inside the jet orifice 20, and also homogenizes the power density in the radial direction. With the jet 21 running continuously, the cathode 22 is driven into the desired position by means of the xyz table 51, etc. The laser 40 is then switched on followed by the application of the anode-cathode voltage from a potentiostat 15. To maintain constant current, potentiostat 15 is set to operate galvanostatically, i.e, at constant current. Current densities as high as 16 amps/cm$^2$ result in plating rates as high as about 10 micrometers per second with bright gold deposits of excellent metallurgical quality. With a smaller nozzle, i.e. 0.35 mm in diameter, rates as high as 30 micrometers/sec were achieved, indicating our plating rates with the larger nozzle are limited by the available laser power.

Cross sections of laser-jet-plated gold spots are shown in FIGS. 2.1–2.3. Examination of their morphology indicates dense deposits consisting of small grains, free of cracks and pores. Upon electroetching, the samples were found to possess a columnar structure, typically found in pure soft gold deposits. In addition good adhesion between the gold and about 1 micrometer thick nickel was found based on an adhesive-tape pull test.

FIGS. 2.1–2.3 show cross-sections of laser-jet plated gold spots on nickel plated Be-Cu substrates, 200 micrometers thick. The current density is 11 amperes/cm$^2$. In each case the top layer is an electrodeposited nickel layer deposited to protect the gold during cross-sectioning and polishing. Laser-jet plating times and resulting thicknesses are:

FIG. 2.1 plated for 0.5 second, with 4.5 micrometers thickness;

FIG. 2.2 plated for 1 second, 8 micrometers; and

FIG. 2.3 plated for 5 seconds, 30 micrometers.

In contrast, cross-sections of deposits using the same jet and current density as in FIG. 2, but without laser radiation during plating are shown in FIGS. 3.1–3.3. Here are shown cross-sections of jet plated areas produced without the use of laser power during deposition. Substrates and current densities are the same as for FIGS. 2.1–2.3. Plating times and resulting thicknesses are:

FIG. 3.1 plated for 1 second, 3 micrometers;

FIG. 3.2 plated for 5 seconds, 12.5 micrometers and;

FIG. 3.3 plated for 10 seconds, 25 micrometers.

Note the cracks and pores throughout the deposits, irrespective of gold film thickness in contrast to laser-jet plating, as illustrated by FIGS. 2.1–2.3 Here cracks are found to occur throughout the deposit for films irrespective of film thickness. The cracks apparently initiate at the nickel-gold interface. This type of columnar deposit with columns physically separated from each other is typical of metal deposits occurring at/or near the limiting current density for a given agitated solution. Such adhesive-tape pull-testing of these deposits showed extremely poor adhesion with the gold separating from the substrate and adhering to the tape.

We also found that laser-jet plated spots normally contain peripheral deposition areas not subjected to laser light i.e. in the wall region which are also removed with adhesive-type tape while the central laser-plated portion remains intact.

Thus three experimentally observed functions arising from the laser-jet-deposition of gold can be identified: (1) an increase in plating speed due to local laser heating of the cathode, (2) improved adhesion, probably caused by a cleaner cathodic surface resulting from local heating at the surface thereby providing stronger bonding for the nucleating atoms, and (3) crack-free, dense deposits, due to a shift of the limiting-current density to much higher values than are possible for the jet alone and possibly due to annealing of internal film stresses that occur simultaneously with the deposition process due to laser heating. It is important to point out that it is possible to obtain gold deposits of the quality and structure of FIGS. 2 A-C from jet plating without the laser, but at current densities (hence plating rates) at least one order of magnitude smaller than those of FIGS. 2.1–2.3. (See Haynes et al supra) The new laser-jet technique has been demonstrated to have the highest plating rate for gold reported to date. The technique should also be applicable to numerous other plating systems such as Cu/Cu$^{++}$. Earlier work on the Cu/Cu$^{++}$ system showed laser plating rates without the jet to be as high as 10 micrometers per second with about two watts of argon laser power (Puippe et al supra.) The use of laser-jet plating in combination with reel-to-reel plating machines seems attractive for producing high yields of maskless patterned parts. Laser-jet etching can also be employed as a means for producing high-speed material removal.

LARGE DIAMETER JET

In this embodiment, the jet of electrolyte is large in diameter as contrasted to the diameter of the converging collinear laser beam. In this configuration, the jet acts not only as a source of resupply of ions to the electrolyte, but as a uniform medium for carrying the beam to a sharp focus at the cathode (anode). This is in contrast to using the jet as an electromagnetic waveguide which precludes a very sharp focus as it results in a spot approximately equal in diameter to the diameter of the plating or etching jet. For most etching applications and some plating applications, the sharper focus of the laser beam is necessary and it would be very difficult to obtain in the waveguide form of jet of liquid.

Thus, for very fine patterning (plating or etching) the jet of fluid (free or submerged) will not act as a waveguide for the light but permit a large ion resupply moving collinearly with the focussed laser beam used for processing.

EXAMPLE I

With reference to Table I, we electroplated pure gold from Autronex 55GV (4 troy ounces of gold per gallon) onto sulfamate nickel plated Be-Cu thin stock using this laser-jet plating technique. Quartz flow cells were employed. Jet streams of 0.35 mm and 0.5 mm diameter were employed. In both cases, the laser beam was directed collinearly through the jet stream in a waveguide mode. The results obtained in conjunction with the argon laser run at 20–25 watts CW were as follows.

1. With the first cell, plating rates as high as 50 micrometers per second yielded 100 micrometer diameter gold needles up to about 1 mm in height. The quality of these deposits is quite porous.

2. Plating rates of 20 micrometers per second yielding high quality gold in terms of smoothness, brightness and adhesion. These deposits have been examined both optically and by SEM. Spots about 2-4 micrometers in height and 350 micrometers wide were produced with a single 200 milliseconds light pulse.

3. Lines were produced in a jet cell, scanning at 12 mm per second by moving the sample within the cell, relative to the laser beam. The width of these lines was about 0.7 mm.

4. Gold spots 550 micrometers in diameter plated at the rate of 10 micrometers per second with the second jet cell. SEM photographs show a fine grain, pore free structure.

5. Adhesion of the laser-jet region subjected to the adhesive-tape test. It was observed that a peripheral plating region, not subjected to laser radiation peels off readily while the central irradiated region does not. This result is consistent with the straight free jet plating results, without a laser in which spots produced with a free jet always crack or peel. In order to have adhesion, relative movement of the jet and the sample is required. Maximum plating rates for good quality free jet plated lines are about 0.3 micrometers per second, approximately sixty times slower than our laser-jet technique.

This technique is applicable to plating of metals such as copper, nickel, palladium, etc.

FIG. 4 is a sectional view of a demountable laser-jet cell 70 which can be employed in accordance with this invention. The demountable laser-jet cell 70 permits flexibility for laser-jet plating or etching. The features include a demountable quartz optical window 74 at one end of the cell. Secondly, there is a demountable flat plate 60 carrying the jet nozzle 20. The fact that it is demountable permits substitution of other such plates 60 enabling a choice of arbitrary diameter, length and material of jet nozzle 20. The jet support flange 72 is adapted for mounting various materials for anode 16, compatible with the desired electrolyte 25 (plating or etching solution) required for processing. An access port 94 is provided for inserting the workpiece 22 (electrode, etc.) to be processed. A rear demountable window 91 is provided for easy alignment of the laser beam entering window 74 and the jet of fluid 21 passing through the orifice of nozzle 20.

The cell 70 includes a cylinder 71 of transparent acrylic plastic having a work access port 94 into which the cathode 22 (workpiece to be electroplated) is inserted. The jet plate 60 containing the jet orifice or nozzle 20 is secured to the flange 72 by means of jet retainer flange 171, which is bolted thereto by a set of bolts 172. Front flange 73 holds laser window 74. Acrylic front flange 73 has a large hole 89 for window 74. Holes 76 pass through flanges 73 and 72 and into the end of cylinder 71 so that an inlet chamber 12 is formed by jet plate 60, support flange 72, flange 73 and window 74. The electrolyte is supplied to the inlet chamber 12 through an inlet opening 80 (FIG. 5) connected to inlet line 31 shown in FIG. 1.2. Port 81 is a bleeder line to permit removal of air from the chamber 12 through a petcock (not shown) and port 82 is a drain line for the liquid when disassembling the cell to make alterations in its structure. Anode 16 is secured to the wall of the jet support flange 72 by means of a threaded screw 83 which passes through the flange 72 and is secured thereto. Flange 72 is composed of acrylic plastic which is an electrical insulating material. Thus, the screw 83 which also connects the power to the anode 16 is electrically insulated, as required. It can be seen that the cathode 22 is suspended by support member 84 through the port 94 in the cylinder 71. Electrical connection to cathode 22 is shown by conductor line 85. The drain 86 for the jet of electrolyte falling down from the cathode 22 is shown in cylinder 71. To the right end of the cylinder 71 is affixed a window support flange 88 with mounting holes aligned with corresponding holes in cylinder 71 through which bolts 87 extend. The transparent window 91 is held over hole 90 in support flange 88 by rear flange 92 secured to flange 88 by bolts 93. Support flange 88 is attached to cylinder 71 by means of bolts 87.

Fluid-tight seals are provided by the four standard elastomeric O-rings 98 shown in the drawings. Corresponding annular grooves are provided in parts into which the O-rings are seated, in conventional manner FIGS. 5.1 and 5.2 show the jet support flange 72 in end and side views respectively with the various apertures illustrated.

FIG. 6 shows two curves for plating rate versus current density for laser-jet plating on the upper curve and jet plating without the laser on the lower curve. In this case Autronex 55GV was used (pure gold) with laser power at 25 watts, nozzle diameter at 0.5 mm, flow rate at 2.15 cc/second, and bath temperature at 60 degrees Celsius.

BILEVEL PLATING AND ETCHING

The use of a wide jet in conjunction with a narrow focussed laser can result in (1) Two plating rates for patterning a center section that is plated to a much higher value than the periphery;

(2) two etching rates, the center being deeper than the periphery, or (3) a single very high etching rate defined by the laser with slow peripheral etching, depending on the electrolyte, etchant, and applied potential (if any.) Here, the jet has a stagnation region that is much larger in diameter than the laser, hence allowing for the two finite plating or etching rates to occur.

FIG. 7.1 shows an example of bilevel plating. A substrate 200 is shown with a jet-plating jet 204 directed onto a spot on the substrate 200 where a thickness 202 of gold is plated. In the center of the spot of gold 202 is directed a laser beam 205 collinearly which results in a thicker deposit 203 of gold.

FIG. 7.2 shows an example of bilevel etching. A substrate 300 is shown with a jet-etching jet 304 directed onto a spot on the substrate 300 where a hole 302 is etched in substrate 300. In the center of the hole 302 is directed a laser beam 305 collinearly which results in a deeper hole 303.

PHOTOLYTIC ELECTROLYTES

The invention can also be employed where the electrolyte used is adapted for photolytic decomposition for either etching or plating. The photolytic plating or etching can be employed either with or without an external source of electrical potential.

Note that as used herein plating and etching are intended to include chemical deposition or removal of material.

HEATING WITH ENERGY BEAM

In order for the energy beam to provide the type of heating required for heating the substrate as described above, the energy beam or laser must be adapted to provide an energy of at least about $10^2$ Watts per square centimeter on the surface to be treated in accordance with this invention. The ability to plate/etch hard to access areas such as hollow surfaces, crevices and recessed areas is greatly enhanced by the instant laser-jet system.

What is claimed is:

1. In a process of chemically-enhanced additive or subtractive processing of a substrate in a chemically-active electrolyte fluid, the improvement comprising directing a high intensity energy beam to heat said substrate at the site to be treated concomitantly with simultaneously directing a jet of said fluid at the locus of desired enhanced-chemical action on said substrate, said energy beam being collinear with said jet, said site and said locus coinciding at the same spot, and said beam having a diameter comparable to or less than the diameter of said jet at said locus.

2. The method in accordance with claim 1 wherein said fluid comprises an electrolyte with said beam cooperating with said fluid to enhance the rate of said process at said site.

3. The method of claim 2 wherein said additive or subtractive processing is performed electrochemically.

4. In a process of chemically-enhanced additive or subtractive processing of a substrate in a chemically-active fluid, directing a high intensity, laser energy beam to heat said substrate at the site to be treated concomitantly with directing a jet of said fluid at the locus of desired enhanced-chemical action on said substrate, said laser beam being collinear with said jet and said jet of fluid serving as an optical waveguide for said beam, whereby said processing is focussed on an area defined by the point of impact of said jet upon said substrate.

5. The process of claim 1 wherein said jet can be either a free-standing jet or a submerged jet, said jet is collinear with said energy beam, and said energy beam comprises a laser beam,
with said beam cooperating with said fluid to enhance the rate of said process at said site.

6. A process in accordance with claim 1 wherein said jet is larger in diameter than said energy beam thereby permitting a large ionic resupply surrounding a finely focussed energy beam employed for patterning (etching/plating),
with said beam cooperating with said fluid to enhance the rate of said process at said site.

7. A process in accordance with claim 6 wherein said beam is a laser beam.

8. A process of chemical treatment with a chemical fluid comprising an electrolyte and an energy beam in jet-chemical plating and jet-chemical etching of any variety to achieve improved product quality at high rates of plating or etching, providing a jet of said chemical fluid, said energy beam being collinear with said jet,
wherein plating or etching is accomplished selectively by applying said energy beam to sites to be plated or etched concomitantly with use of a said jet to circulate the plating solution rapidly at the locus to be plated more rapidly on the surface of the object to be plated,
said site and said locus coinciding at the same spot, with said beam cooperating with said fluid to enhance the rate of said process at said site, and
said beam having a diameter comparable to or less than the diameter of said jet at said locus.

9. The process of claim 8 wherein said energy beam is directed through said jet of fluid, so that it passes along the length of the jet of fluid which acts as an optical waveguide for said energy beam.

10. The process of claim 9 wherein said energy beam comprises a laser,
with said beam cooperating with said fluid to apply energy to said substrate at said site,
whereby said process performed by said chemical fluid is accelerated at said site as contrasted with the surrounding areas near said site and within said locus.

11. The process of claim 1 wherein said energy beam has an energy density of at least about $10^2$ watts per $cm^2$.

12. The process of claim 9 wherein said energy beam has an energy density of at least about $10^2$ watts per $cm^2$,
with said beam cooperating with said fluid to apply energy to said substrate at said site,
whereby said process performed by said chemical fluid is accelerated at said site as contrasted with the surrounding areas near said site and within said locus.

13. The process of claim 8 wherein a substrate is located in a chamber and said energy beam is directed through a free-standing jet stream of a solution of said electrolyte containing an active chemical species adapted to interact with said substrate, with said beam cooperating with said fluid to apply energy to said substrate at said site, whereby said process performed by said chemical fluid is accelerated at said site as contrasted with the surrounding areas near said site and within said locus.

14. The process of claim 12 wherein said energy beam is a laser beam and said jet acts as a light guide, said laser beam passing through said jet to said site within said locus, said jet of fluid having optical characteristics trapping the light of said laser within the fluid column of said jet.

15. The energy beam of claim 1 wherein said energy beam comprises a microwave beam,
with said beam cooperating with said fluid to enhance the rate of said process at said site.

16. The energy beam of claim wherein said beam comprises a microwave beam.

17. A process in accordance with claim 1 wherein said energy beam comprises a laser beam having a diameter comparable to the diameter of the jet of electrolyte,
whereby both the fluid of said jet and the light of said laser strike the substrate coincidentally, i.e. in the same spot,
with said beam cooperating with said fluid to enhance the rate of said process at said site.

18. A process in accordance with claim 8 wherein said energy beam comprises a laser beam having a diameter comparable to the diameter of the jet of electrolyte,
whereby both the fluid of said jet and the light of said laser strike the substrate coincidentally, i.e. in the same spot,
with said beam cooperating with said fluid to apply energy to said substrate at said site,
whereby said process performed by said chemical fluid is accelerated at said site as contrasted with the surrounding areas near said site and within said locus.

19. A process in accordance with claim 1 wherein said process is an electrochemical process with an anode and a cathode with a voltage between the anode and the cathode,
said voltage being applied by a power supply connected between said substrate onto which the jet and the laser are impinging and an electrode suitably positioned inside the compartment containing the nozzle for producing said jet of fluid,
with said beam cooperating with said fluid to enhance the rate of said process at said site.

20. A process in accordance with claim 8 wherein said process is an electrochemical process with an anode and a cathode with a voltage between the anode and the cathode,
said voltage being applied by a power supply connected between said substrate onto which the jet and the laser are impinging and an electrode suitably positioned inside the compartment containing the nozzle for producing said jet of fluid,
with said beam cooperating with said fluid to apply energy to said substrate at said site,
whereby said process performed by said chemical fluid is accelerated at said site as contrasted with the surrounding areas near said site and within said locus.

21. The process of chemically-enhanced additive plating or subtractive etching of a substrate in a chemically-active fluid,
while directing a high intensity energy beam to heat said substrate at the site to be treated concomitantly with directing a jet of said fluid at the locus of desired enhanced-chemical action on said substrate said energy beam being collinear with said jet, said site and said locus coinciding at the same spot, wherein said plating or etching is accomplished selectively by applying an energy beam such as an electromagnetic beam preferably in the form of laser to spots to be plated concomitantly with use of a jet to transport the plating solution rapidly to and at the surface of the object to be chemically treated by plating, etching, etc. whereby said laser beam is passed along the length of the jet of fluid which acts as a light guide or waveguide for the laser beam, and said beam having a diameter comparable to or less than the diameter of said jet at said locus.

22. A process of chemical treatment with a chemical fluid comprising an electrolyte and an energy beam in jet-chemical plating and jet-chemical etching of any variety to achieve improved product quality at high rates of plating or etching, providing a jet of said chemical fluid, said energy beam being collinear with said jet, said site and said locus coinciding at the same spot, wherein plating or etching is accomplished selectively by applying said energy beam to sites to be plated or etched concomitantly with use of a said jet to circulate the plating solution rapidly at the locus to be plated more rapidly on the surface of the object to be plated, with said beam cooperating with said fluid to enhance the rate of said process at said site, said plating or etching being accomplished selectively by applying an energy beam such as an electromagnetic beam preferably in the form of laser to spots to be plated concomitantly with use of a jet to transport the plating solution rapidly to and at the surface of the object to be chemically treated by plating, etching, etc. whereby said laser beam is passed along the length of the jet of fluid which acts as a light guide or waveguide for the laser beam, and said beam having a diameter comparable to or less than the diameter of said jet at said locus.

23. In a process of chemically-enhanced additive or subtractive processing of a substrate in a photolytic chemically-active fluid, said fluid comprising an electrolyte, the improvement comprising directing a laser beam to illuminate said substrate at the site to be treated concomitantly with directing a jet of said fluid at the locus of desired enhanced-chemical action on said substrate, with said beam cooperating with said fluid to apply energy to said substrate at said site, whereby said process performed by said chemical fluid is accelerated at said site as contrasted with the surrounding areas near said site and within said locus, and said beam having a diameter comparable to or less than the diameter of said jet at said locus.

24. A process of chemically-enhanced additive or subtractive processing of a substrate in an electroplating fluid bath comprising directing a high intensity energy beam to heat said substrate at the site on said substrate to be treated concomitantly with directing a jet of said fluid at the locus of desired enhanced-chemical action on said substrate at said site, said jet and said beam being collinear, said plating or etching being accomplished selectively by applying said beam to spots to be processed concomitantly with use of said jet to transport the plating solution rapidly to and at the surface of the object to be chemically processed, said beam being passed along the length of the jet of fluid which acts as a light guide or waveguide for said beam, and said beam having a diameter comparable to or less than the diameter of said jet at said locus.

25. A process of chemically-enhanced additive or subtractive processing of a substrate in an electroless fluid bath, said bath comprising an electrolyte, comprising directing a high intensity energy beam to heat said substrate at the site on said substrate to be treated concomitantly with directing a jet of said fluid at the locus of desired enhanced-chemical action on said substrate at said site, said jet and said beam being collinear, said plating or etching being accomplished selectively by applying said beam to spots on said substrate to be processed concomitantly with use of said jet to transport the plating solution rapidly to and at the surface of said substrate to be chemically processed, said beam being passed along the length of said jet of fluid which acts as a light guide or waveguide for said beam, with said beam cooperating with said fluid to apply energy to said substrate at said site, whereby said process performed by said chemical fluid is accelerated at said site as contrasted with the surrounding areas near said site and within said locus, and said beam having a diameter comparable to or less than the diameter of said jet at said locus.

26. A process of chemically-enhanced additive or subtractive processing of a substrate in an electrodeless fluid bath comprising employing a fluid bath comprising an electrolyte, directing a high intensity energy beam to heat said substrate at the site on said substrate to be treated concomitantly with directing a jet of said fluid at the locus of desired enhanced-chemical action on said substrate, said locus being at said site, said jet and said beam being collinear, said processing being accomplished selectively by applying said beam to spots on said substrate to be processed concomitantly with use of said jet to transport the plating solution rapidly to and at the surface of said substrate to be chemically processed, said beam being passed along the length of said jet of fluid which acts as a light guide or waveguide for said beam, with said beam cooperating with said fluid to apply energy to said substrate at said site, whereby said process performed by said chemical fluid is accelerated at said site as contrasted with the surrounding areas near said site and within said locus, and said beam having a diameter comparable to or less than the diameter of said jet at said locus.

27. A process of chemically-enhanced additive or subtractive processing of a substrate in an exchange plating fluid bath said bath comprising an electrolyte said process comprising directing a high intensity energy beam to heat said substrate at the site on said substrate to be treated concomitantly with directing a jet of said fluid electrolyte at the locus of desired enhanced-chemical action on said substrate at said site, said jet and said beam being collinear, said plating or etching being accomplished selectively by applying said beam to spots on said substrate to be processed concomitantly with use of said jet to transport the plating solution rapidly to and at the surface of said substrate to be chemically processed, said beam passing along the length of said jet of fluid which acts as a light guide or waveguide for said beam, with said beam cooperating with said fluid to apply energy to said substrate at said site, whereby said process performed by said fluid is accelerated at said site as contrasted with the surrounding areas near said site and within said locus, and said beam having a diameter comparable to or less than the diameter of said jet at said locus.

28. The process of claim 1 wherein said fluid comprises a liquid electrolyte with said beam cooperating with said fluid to enhance the rate of said process at said site.

29. The process of claim 1 wherein said energy beam is directed along an axis which intersects said jet of fluid downstream from the origin thereof and merges therewith to travel collinearly therealong with said beam cooperating with said fluid to enhance the rate of said process at said site.

30. A process of plating by employing a jet plating system employing a jet of plating fluid, said fluid comprising an electrolyte, said jet comprising a relatively wide jet in conjunction with a relatively narrow focussed laser beam with said beam and said jet being directed at the same site on a substrate, with said beam covering a smaller surface within the surface covered by said jet, said beam having a diameter comparable to or less than the diameter of said jet at said locus, with two plating rates for patterning a center section that is plated to a much higher value than the periphery, and said beam having a diameter less than the diameter of said jet at said site.

31. A process of etching by employing a jet etching system employing a jet of etching fluid comprising an electrolyte, and said jet comprising a relatively wide jet in conjunction with a relatively narrow focussed laser beam with said beam and said jet being directed at the same site on a substrate, with said beam covering a smaller surface within the surface covered by said jet, said beam having a diameter less than the diameter of said jet at said site, with two etching rates, the center etching rate being greater than that at the periphery.

32. A process of etching by employing a jet etching system employing a jet of etching fluid, said etching fluid comprising an electrolyte, and said jet comprising a relatively wide jet in conjunction with a relatively narrow focussed laser with a single very high etching rate defined by the laser with low peripheral etching, depending on the etchant, where, said jet has a stagnation region that is much larger in diameter than said laser, hence allowing for the two finite etching rates to occur simultaneously, whereby said beam has a diameter less than the diameter of said jet at said site.

33. A process of plating a metal on a substrate by employing a jet plating system employing a jet of plating fluid comprising an electrolyte, said jet comprising a relatively wide jet in conjunction with a relatively narrow focussed laser beam with two plating rates, a substrate, the center plating rate being greater than the plating rate at periphery, said jet being directed onto a spot on said substrate where a thickness of metal is plated, said laser beam being directed collinearly with said jet at the center of said spot of metal which results in a thicker deposit of metal at said center of said spot, and said beam having a diameter less than the diameter of said jet at said site.

34. A process of plating/etching by employing a jet plating/etching system employing a jet of plating/etching, electrolyte fluid comprising a relatively wide jet in conjunction with a relatively narrow focussed laser beam with a single very high plating/etching rate defined by said laser beam with low peripheral plating/etching, said beam and said jet being directed onto a spot on said substrate, where, said jet has a stagnation region that is much larger in diameter than said laser, and said beam having a diameter less than the diameter of said jet at said spot, hence allowing for the two finite plating/etching rates to occur.

35. A process of etching a substrate by employing a jet etching system employing an electrolyte fluid and a jet comprising a wide jet of etching fluid in conjunction with a narrow focussed laser beam with two etching rates, the center etching rate resulting from etching on a site where said beam hits said substrate being greater than the etching rate at the periphery of said site, a jet-etching jet directed onto a spot on said substrate where a hole is etched in said substrate, and a laser beam is directed, collinearly with said jet, with said site where said beam is directed being at the center of said hole, and said beam having a diameter less than the diameter of said jet at said spot, which results in a deeper hole at said site in said center of said hole.

36. In a process of chemically-enhanced electroetching of a substrate in a chemically-active electrolyte fluid, the improvement comprising directing a high intensity energy beam to heat said substrate at the site to be treated concomitantly with directing a jet of said electrolyte fluid at the locus of desired enhanced-chemical action on said substrate, said site being included within said locus, and said beam having a diameter at said site comparable to or less than the diameter of said jet at said locus.

37. In a process of chemically-enhanced electroless etching of a substrate in a chemically-active electrolyte fluid, the improvement comprising directing a high intensity energy beam to heat said substrate at the site to be treated concomitantly with directing a jet of said electrolyte fluid at the locus of desired enhanced-chemical action on said substrate, said beam passing collinearly through said jet to said site, said site being included within said locus, and said beam having a diameter at said site comparable to or less than the diameter of said jet at said locus.

38. In a process of chemically-enhanced electrodeless etching and/or exchange etching of a substrate in a chemically-active electrolyte fluid, the improvement comprising diverting a high intensity energy beam to heat said substrate at the site to be treated concomitantly with directing a jet of said electrolyte fluid at the locus of desired enhanced-chemical action on said substrate, said beam passing collinearly through said jet to said site, said site being included within said locus, and said beam having a diameter at said site comparable to or less than the diameter of said jet at said locus.

39. In a process of chemically-enhanced etching and/or exchange etching of a substrate in a chemically-active, electrolyte fluid, the improvement comprising directing a high intensity energy beam to heat said substrate at the site to be treated concomitantly with directing a jet of said fluid at the locus of desired enhanced-chemical action on said substrate, said beam passing collinearly through said jet to said site, said site being included within said locus, and said beam having a diameter at said site comparable to or less than the diameter of said jet at said locus.

40. In a process of chemically-enhanced electroplating of a substrate in a chemically-active, electrolyte fluid, the improvement comprising directing a high intensity energy beam to heat said substrate at the site to be treated concomitantly with directing a jet of said electrolyte fluid at the locus of desired enhanced-chemical action on said substrate, said beam passing collinearly through said jet to said site, said site being included within said locus, and said beam having a diameter at said site comparable to or less than the diameter of said jet at said locus.

41. In a process of chemically-enhanced electroless plating of a substrate in a chemically-active electrolyte fluid, the improvement comprising directing a high intensity energy beam to heat said substrate at the site to be treated concomitantly with directing a jet of said electrolyte fluid at the locus of desired enhanced-chemical action on said substrate, said beam passing collinearly through said jet to said site, said site being included within said locus, and said beam having a diameter at said site comparable to or less than the diameter of said jet at said locus.

42. In a process of chemically-enhanced electrodeless plating and/or exchange plating of a substrate in a chemically-active electrolyte fluid, the improvement comprising directing a high intensity energy beam to heat said substrate at the site to be treated concomitantly with directing a jet of said electrolyte fluid at the locus of desired enhanced-chemical action on said substrate, said beam passing collinearly through said jet to said site, said site being included within said locus, and said beam having a diameter at said site comparable to or less than the diameter of said jet at said locus.

43. In a process of chemically-enhanced plating of a substrate in a chemically-active fluid, the improvement comprising directing a high intensity energy beam to heat said substrate at the site to be treated concomitantly with directing a jet of said fluid at the locus of desired enhanced-chemical action on said substrate, said site being included within said locus, and said beam having a diameter at said site comparable to or less than the diameter of said jet at said locus.

44. A laser-jet plating system including a plating fluid comprising an electrolyte, means for providing a source of a laser beam, a workpiece, a jet nozzle for emitting a jet of plating fluid, a lens, said laser beam being directed through said lens to focus approximately at the center of said jet nozzle, a numerically-controlled drive, a cathode attached to said numerically-controlled drive and to said workpiece, said jet both resupplying ions to be plated and acting as an optical waveguide or light pipe for said laser beam means for simultaneously directing said jet of said fluid at the locus of desired enhanced-chemical action on said substrate, said laser beam being collinear with said jet, said site and said locus coinciding at the same spot, with said beam cooperating with said fluid to enhance the rate of said system at said site, and said beam having a diameter at said site comparable to or less than the diameter of said jet at said spot.

45. A laser-jet system for chemical treatment with an electrolyte including a source of a laser beam, a chemical solution comprising an electrolyte, a laser-jet cell with an inlet chamber containing said chemical solution maintained under pressure, said chamber including an electrode, a jet nozzle, a workpiece to be chemically treated with said solution, said workpiece being supported for relative motion with respect to the jet from said nozzle for patterning by treatment with said chemical solution, said laser beam being directed through said jet nozzle, said electrode being connected to said workpiece, means for simultaneously directing said jet of said fluid at the locus of desired enhanced-chemical action on said workpiece, said laser beam being collinear with said jet, said site and said locus coinciding at the same spot, with said beam cooperating with said fluid to enhance the rate of said system at said site, and said beam having a diameter at said site comparable to or less than the diameter of said jet at said spot.

46. A laser-jet chemical treatment system including a source of a laser beam, a laser-jet cell with an inlet chamber containing a chemical solution comprising an electrolyte maintained under pressure, said chamber including an electrode, a jet nozzle, a workpiece to be chemically treated with said electrolyte solution, said workpiece being supported for relative motion with respect to the jet from said nozzle for patterning by treatment with said chemical solution,
a cathode
said cathode being connected to said workpiece
said reservoir being heated by a heating means,
said electrolyte solution being circulated through a line to a pump,
with the outlet of said pump being connected by another line to said inlet chamber, and
said laser beam being directed through said jet nozzle
said jet nozzle and said laser being adapted for simultaneously directing said jet of said solution at the locus of desired enhanced-chemical action on said workpiece,
said laser beam being collinear with said jet,
said site and said locus coinciding at the same spot,
with said beam cooperating with said fluid to enhance the rate of chemical treatment of said workpiece by said system at said site, and
said beam having a diameter at said site comparable to or less than the diameter of said jet at said spot.

47. The system in accordance with claim 45 wherein said electrolyte is preheated by heater means.

48. A system in accordance with claim 46 wherein said laser beam is a cw argon laser beam.

49. A process of plating with an electrolyte fluid by the use of a wide jet in conjunction with a narrow focussed laser with a single very fine plating rate defined by the laser with no peripheral plating, depending on the plating solution,
said jet having a stagnation region that is much larger in diameter than said jet, hence allowing for the two finite plating jobs to occur simultaneously,
said jet being collinear with said energy beam with said beam cooperating with said fluid to enhance the rate of said process at said site, and
said beam having a diameter at said site comparable to or less than the diameter of said jet at said site.

50. A laser-jet treatment system including
means for producing an energy beam,
a jet nozzle having an input and an output for emitting said jet of chemically-active fluid,
said energy beam being directed through a lens to focus approximately at the center of the input of said jet nozzle and to pass therethrough,
a workpiece aligned with the output of said nozzle for said chemically active electrolyte fluid and said energy beam aligned for said fluid and said beam to hit said workpiece simultaneously at the same locus, and
said beam having a diameter at said site comparable to or less than the diameter of said jet at said locus.

51. A system in accordance with claim 50 wherein said energy beam passes through a window transparent to said energy beam in a chamber adapted to contain said electrolyte fluid confined for ejection through said nozzle towards said workpiece.

52. A system in accordance with claim 50 wherein an electrode is housed within said chamber for containing said electrolyte or in electrical contact with said chamber and said workpiece comprises another electrode in an electrochemical treatment system.

53. A system in accordance with claim 51 wherein said electrolyte fluid is maintained under pressure in said chamber.

54. A laser-jet treatment system including
means for producing an energy beam,
a jet nozzle having an input and an output for emitting said jet of chemically-active fluid,
said energy beam being directed through a lens to focus approximately at the center of the input of said jet nozzle and to pass therethrough,
a workpiece aligned with the output of said nozzle for said chemically active fluid and said energy beam to hit said workpiece simultaneously at the same locus,
with said energy beam comprising a laser beam,
a laser-jet cell with an inlet chamber containing a chemical solution maintained under pressure,
said chamber including an electrode,
a workpiece to be chemically treated with said solution connected to said electrode,
said workpiece being supported for relative motion with respect to the jet from said nozzle for patterning by treatment with said chemical solution,
said reservoir being heated by a heating means,
said electrolyte being circulated through a line to a pump,
with the outlet of said pump being connected by another line to said inlet chamber,
said laser beam being directed through said jet nozzle,
said chemically active fluid and said energy beam being aligned for said fluid and said beam to hit said workpiece simultaneously at the same locus, and
said beam having a diameter at said site comparable to or less than the diameter of said jet at said locus.

* * * * *

UNITED STATES PATENT AND TRADEMARK OFFICE
CERTIFICATE OF CORRECTION

PATENT NO. : 4,497,692
DATED : February 5, 1985
INVENTOR(S) : M. H. Gelchinski, Et Al It is certified that error appears in the above-identified patent and that said Letters Patent is hereby corrected as shown below:

In the drawings, Sheet 2 of 6, insert the following designations on the right hand side of FIGS. 2.1, 2.2, and 2.3:

--Au
Ni

Be-Cu--.

Column 14, line 13, after "claim" insert --1--.

Signed and Sealed this

Second Day of September 1986

[SEAL]

Attest:

DONALD J. QUIGG

Attesting Officer     Commissioner of Patents and Trademarks